(12) United States Patent
Park et al.

(10) Patent No.: US 10,910,572 B2
(45) Date of Patent: Feb. 2, 2021

(54) FLEXIBLE DISPLAY DEVICE

(71) Applicant: SAMSUNG DISPLAY CO., LTD., Yongin-si (KR)

(72) Inventors: Jong-Ryuk Park, Cheonan-si (KR); Hyun-Been Hwang, Suwon-si (KR); Sang Hun Oh, Cheonan-si (KR); Keun Soo Lee, Cheonan-si (KR); Sun Youl Lee, Hwaseong-si (KR); Gyoo Chul Jo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 14/949,663

(22) Filed: Nov. 23, 2015

(65) Prior Publication Data

US 2016/0260915 A1 Sep. 8, 2016

(30) Foreign Application Priority Data

Mar. 5, 2015 (KR) .......................... 10-2015-0031195

(51) Int. Cl.
*H01L 51/52* (2006.01)
*H01L 51/00* (2006.01)
*H01L 27/32* (2006.01)

(52) U.S. Cl.
CPC ...... *H01L 51/0097* (2013.01); *H01L 27/3276* (2013.01); *H01L 51/5246* (2013.01); *H01L 51/5256* (2013.01); *H01L 51/5281* (2013.01); *H01L 51/5293* (2013.01); *H01L 2251/5338* (2013.01); *Y02E 10/549* (2013.01); *Y02P 70/50* (2015.11)

(58) Field of Classification Search
CPC ............ H01L 51/5253; H01L 51/5293; H01L 27/3276
See application file for complete search history.

(56) References Cited

U.S. PATENT DOCUMENTS

| 8,377,762 B2 | 2/2013 | Eguchi et al. | |
| 8,933,470 B2 | 1/2015 | Kim | |
| 10,297,789 B2 | 5/2019 | Jang et al. | |
| 2003/0062519 A1* | 4/2003 | Yamazaki | H01L 51/5253 257/40 |
| 2003/0164674 A1* | 9/2003 | Imamura | H05B 33/04 313/493 |
| 2004/0046909 A1* | 3/2004 | Sekiguchi | G02F 1/1345 349/113 |

(Continued)

FOREIGN PATENT DOCUMENTS

| CN | 103928490 A | 7/2014 |
| CN | 104347816 A | 2/2015 |

(Continued)

*Primary Examiner* — Bryan R Junge
(74) *Attorney, Agent, or Firm* — Lewis Roca Rothgerber Christie LLP

(57) ABSTRACT

A flexible display device including: a display substrate having a display area and a peripheral area surrounding the display area; a plurality of pixels formed in the display area; a passivation layer covering the pixels from the top to protect the pixels; a polarization film layer provided at the top of the passivation layer and of which an edge is extended outside an edge of the passivation layer; and a film wiring made of a flexible material of which one end is connected to the peripheral area.

31 Claims, 12 Drawing Sheets

(56) References Cited

U.S. PATENT DOCUMENTS

| | | | | |
|---|---|---|---|---|
| 2004/0183984 | A1* | 9/2004 | Imajo | G02F 1/13452 349/151 |
| 2007/0145889 | A1* | 6/2007 | Tamura | H01L 51/5281 313/504 |
| 2008/0106685 | A1* | 5/2008 | Choi | G02F 1/13458 349/139 |
| 2011/0304564 | A1* | 12/2011 | Kim | G06F 3/044 345/173 |
| 2012/0107978 | A1* | 5/2012 | Shin | H01L 51/003 438/29 |
| 2012/0139821 | A1* | 6/2012 | Kim | H01L 51/5253 345/76 |
| 2012/0242222 | A1* | 9/2012 | Jung | H01L 51/5253 313/512 |
| 2014/0353625 | A1* | 12/2014 | Yi | H01L 51/5253 257/40 |
| 2015/0060778 | A1* | 3/2015 | Kim | H01L 27/3258 257/40 |
| 2015/0351168 | A1* | 12/2015 | Yasumoto | B32B 7/12 428/216 |
| 2016/0165677 | A1* | 6/2016 | Lee | H05B 33/04 313/504 |

FOREIGN PATENT DOCUMENTS

| | | |
|---|---|---|
| KR | 10-0647702 B1 | 11/2006 |
| KR | 10-2013-0024097 A | 3/2013 |
| KR | 10-2014-0085031 A | 7/2014 |
| KR | 10-2015-0014656 A | 2/2015 |

* cited by examiner

FLEXIBLE DISPLAY DEVICE

CROSS-REFERENCE TO RELATED APPLICATION

This application claims priority to and the benefit of Korean Patent Application No. 10-2015-0031195, filed in the Korean Intellectual Property Office on Mar. 5, 2015, the entire content of which is incorporated herein by reference.

BACKGROUND

1. Field

The following description relates to a display device, and more particularly, to a flexible display device.

2. Description of the Related Art

An organic light emitting diode display is a self-emission display device that has an organic light emitting diode emitting light and displays an image. Unlike a liquid crystal display and/or to relatively reduce a thickness and a weight, the organic light emitting diode display does not require and/or is provided with a separate light source. Further, since the organic light emitting diode display has high-grade characteristics such as low power consumption, high luminance, and/or a high response speed, the organic light emitting diode display has received attention as a next-generation display device for portable electronic devices.

Recently, the organic light emitting diode display has been developed into a flexible display device or a stretchable display device, which can be bent or stretched, by using a flexible or stretchable material as its substrate, such as plastic and/or foil, so that a large area, thin thickness, and/or light weight display device can be realized.

However, because the substrate is formed of the flexible or stretchable material, a semiconductor layer and/or a passivation layer formed on the substrate may be damaged by stress generated when a component such as a display drive integrated circuit (IC) is connected to the substrate.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward a flexible display device capable of suppressing a component formed on a substrate from being damaged due to stress.

An exemplary embodiment of the present invention provides a flexible display device including: a display substrate having a display area and a peripheral area surrounding the display area; a plurality of pixels formed in the display area; a passivation layer covering the pixels from a top of the pixels to protect the pixels; a polarization film layer provided at a top of the passivation layer and of which an edge is extended outside an edge of the passivation layer; and a film wiring made of a flexible material of which one end is connected to the peripheral area.

The flexible display device may further include a semiconductor layer formed on a first surface of the display substrate, in which the pixels may be formed on a first part of the semiconductor layer and the first part of the semiconductor layer is positioned in the display area, and one end of the film wiring may be connected to a second part of the semiconductor layer and the second part of the semiconductor layer is positioned in the peripheral area.

The polarization film layer may have a first region covering an upper surface of the passivation layer and a second region formed outside the first region and covering the edge of the passivation layer.

An end of the second region of the polarization film layer may be formed to be curved toward the display substrate and the end of the second region may be fixed to the semiconductor layer.

The polarization film layer may have a third region formed to be extended outside the second region from the end of the second region and fixed to the semiconductor layer.

The flexible display device may further include an insulating layer covering a part of an upper surface of the semiconductor layer between the edge of the passivation layer and an edge of the film wiring.

The edge of the polarization film layer may be spaced apart from the edge of the insulating layer.

The edge of the polarization film layer may contact the edge of the insulating layer.

The polarization film layer may cover at least a part of an upper surface of the insulating layer.

The edge of the polarization film layer may contact one end of the film wiring.

The passivation layer may include a first inorganic layer covering the pixel, an organic layer covering the first inorganic layer, and a second inorganic layer covering the organic layer and forming an outermost portion of the passivation layer.

In at least one of the first inorganic layer, the second inorganic layer, and the organic layer, a step may be formed between a central portion and an outer portion.

The flexible display device may further include a control substrate of which another end of the film wiring is connected to one side and which is positioned at a second surface of the display substrate facing oppositely away from the passivation layer.

Another exemplary embodiment of the present invention provides a flexible display device including: a display substrate made of a flexible material and having a display area and a peripheral area surrounding the display area outside; a semiconductor layer formed on a first surface of the display substrate and of which a first part is positioned in the display area and a second part is positioned in the peripheral area; a plurality of pixels formed on the first of the semiconductor layer positioned in the display area; a passivation layer covering the pixels at a top of the pixels to protect the pixels and to which pre-stress is applied in a first direction; a polarization film layer covering the passivation layer; a film wiring made of a flexible material of which one end is connected to the second part of the semiconductor layer positioned in the peripheral area; and a control substrate of which another end of the film wiring is connected to one side and which is positioned on a second surface of the display substrate.

The polarization film layer may have a first region covering an upper surface of the passivation layer and a second region formed outside the first region and covering the edge of the passivation layer.

According to the exemplary embodiment of the present invention, it is possible to suppress a passivation layer from being damaged due to stress applied to the substrate.

Further, it is possible to improve manufacturing yield of the flexible display device by suppressing the damage to the passivation layer.

DETAILED DESCRIPTION

Figure 1:
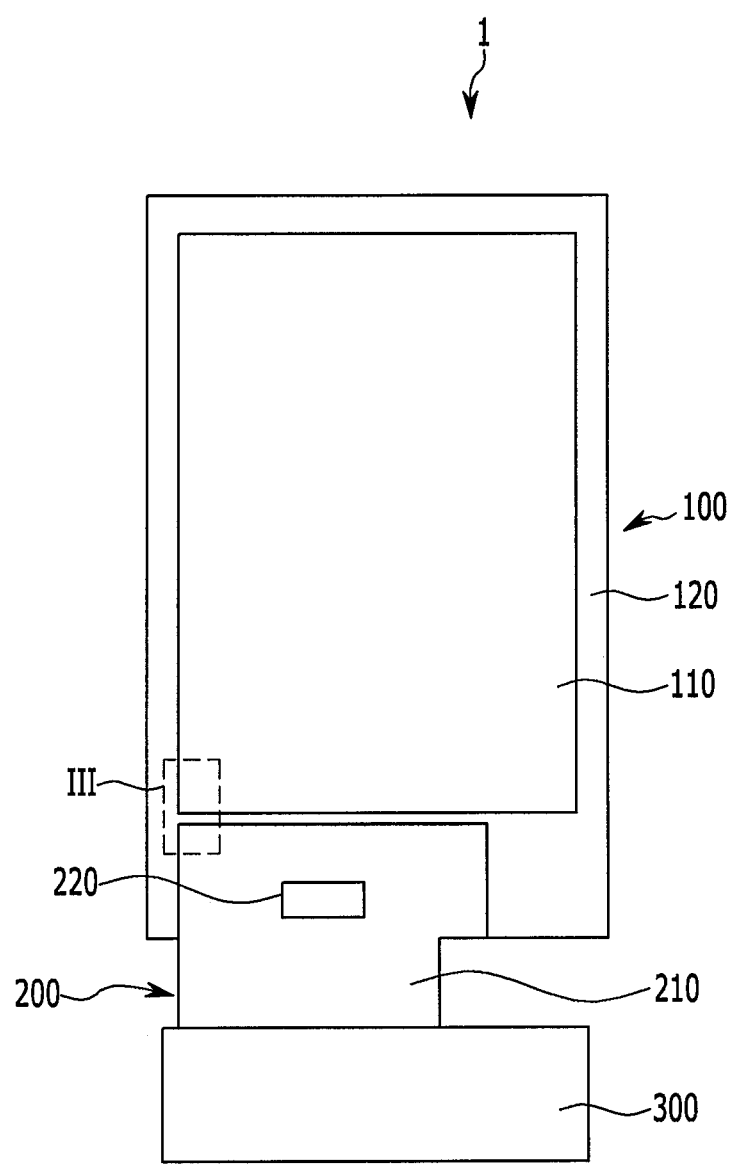
FIG. 1 is a plan view of a flexible display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. In addition, the size and thickness of each configuration shown in the drawings are arbitrarily shown for understanding and ease of description, but the present invention is not limited thereto.

Further, in the specification, the word "on" refers to positioning on or below the object portion, and does not essentially mean positioning on the upper side of the object portion based on a gravity direction. In addition, unless explicitly described to the contrary, the word "comprise" and variations such as "comprises" or "comprising", will be understood to imply the inclusion of stated elements but not the exclusion of any other elements.

Hereinafter, a display device according to exemplary embodiments of the present invention will be described in more detail with reference to the accompanying drawings.

Figure 2:
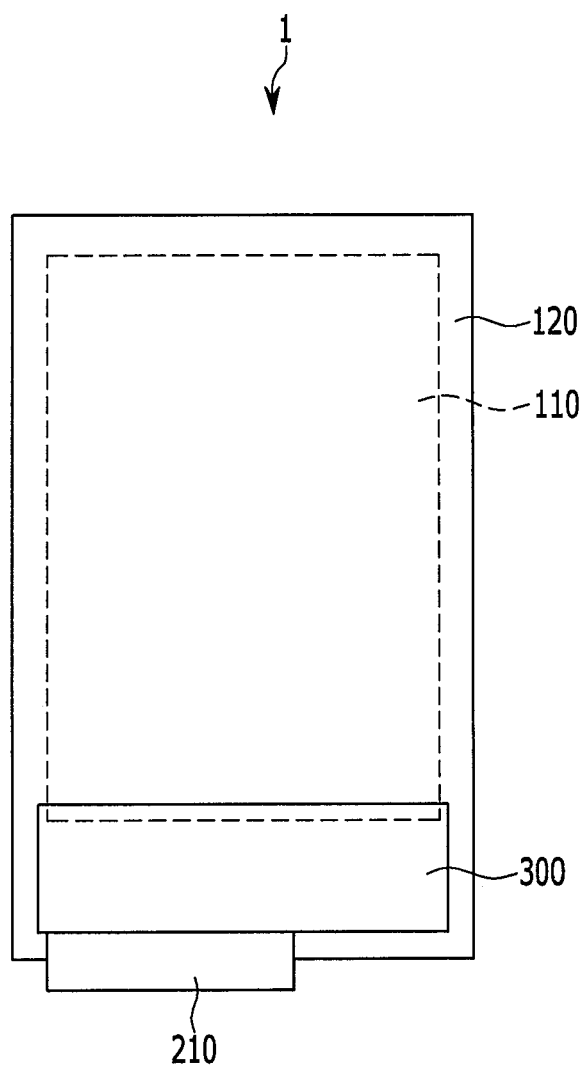
FIG. 2 is a rear view of the flexible display device of FIG. 1.

FIG. 1 is a plan view of a flexible display device according to an exemplary embodiment of the present invention, and FIG. 2 is a rear view of the flexible display device of FIG. 1.

Referring to FIGS. 1 and 2, a flexible display device 1 according to the exemplary embodiment is a display device which is formed of a flexible material to be bent at a desired angle or with a desired shape.

The flexible display device 1 according to the exemplary embodiment may be a liquid crystal display, a field emission display, an organic light emitting diode display device, or an electrophoretic display device.

The flexible display device 1 includes a display substrate 100, a driving chip package 200, and a control substrate 300.

The display substrate 100 is formed of a flexible material such as polyimide, polyethylene terephthalate, polyethylene naphthalate (PEN), poly carbonate, and polyester sulfone (PES), and has a display area 110 in which a plurality of pixels 140 (see, e.g., FIG. 4) is formed and a peripheral area 120 surrounding the display area 110 from the outside.

The driving chip package 200 generates an image signal and the like by receiving a control signal generated in the control substrate 300 to transfer the image signal to the display substrate 100 side and thus an image is displayed.

The driving chip package 200 is formed on a flexible material and includes a film wiring 210 in which a plurality of signal lines is formed and a display driving chip 220 mounted on one side of the film wiring 210. The driving chip package 200 according to the exemplary embodiment may be formed in a chip-on-film (COF) form in which an IC chip is mounted on a base film.

One end of the film wiring 210 is connected to the peripheral area 120 side of the display substrate 100 and thus the image signal and the like are transferred to the display substrate 100 through one end of the film wiring 210.

The control substrate 300 may be formed by a flexible PCB (FPCB). The other end of the film wiring 210 is connected to one surface of the control substrate 300 and thus the control signal generated in the control substrate 300 is transferred to the display driving chip 220 through the other end of the film wiring 210.

While one end and the other end of the driving chip package 200 are connected to the peripheral area 120 of the display substrate 100 and one surface of the control substrate 300, respectively, a rear surface of the control substrate 300 is fixed to a rear surface of the display substrate 100 (see, e.g., FIG. 2).

That is, while the display substrate 100, the driving chip package 200, and the control substrate 300 are sequentially connected to each other, the rear surface of the control substrate 300 and the rear surface of the display substrate 100 face each other by bending the flexible driving chip package 200, and then the rear surface of the control substrate 300 is fixed to the rear surface of the display substrate 100.

Between the rear surface of the display substrate 100 and the rear surface of the control substrate 300, an adhesive member such as, for example, an adhesive tape and/or an adhesive layer is provided.

Meanwhile, since one end of the driving chip package 200 is fixed to the display substrate 100 and the flexible driving chip package 200 is bent, bending stress is applied to the display substrate 100 to which the one end of the driving chip package 200 is fixed due the control substrate 300 and the driving chip package 200 (e.g., due to the weight and/or stress applied from the control substrate 300 and the driving chip package 200).

However, the display substrate 100 is made of the flexible material, and as a result, when the stress is applied on a part of the display substrate 100, the damage may be generated such that deposition layers such as a passivation layer 150 formed on the display substrate 100 are released (separated) from the display substrate 100.

Hereinafter, a configuration for suppressing the damage to the layers formed on the display substrate 100 due to the stress will be described in more detail.

Figure 3:
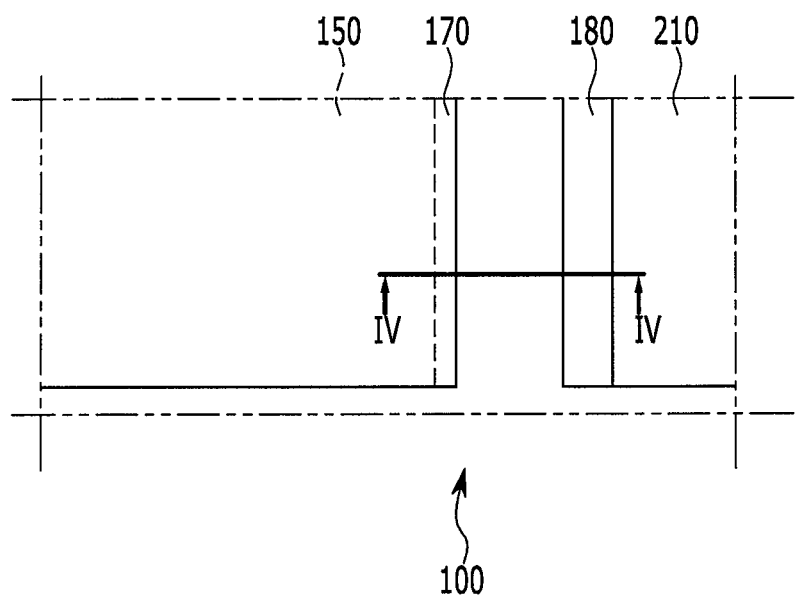
FIG. 3 is an enlarged diagram of a part III of FIG. 1.
Figure 4:
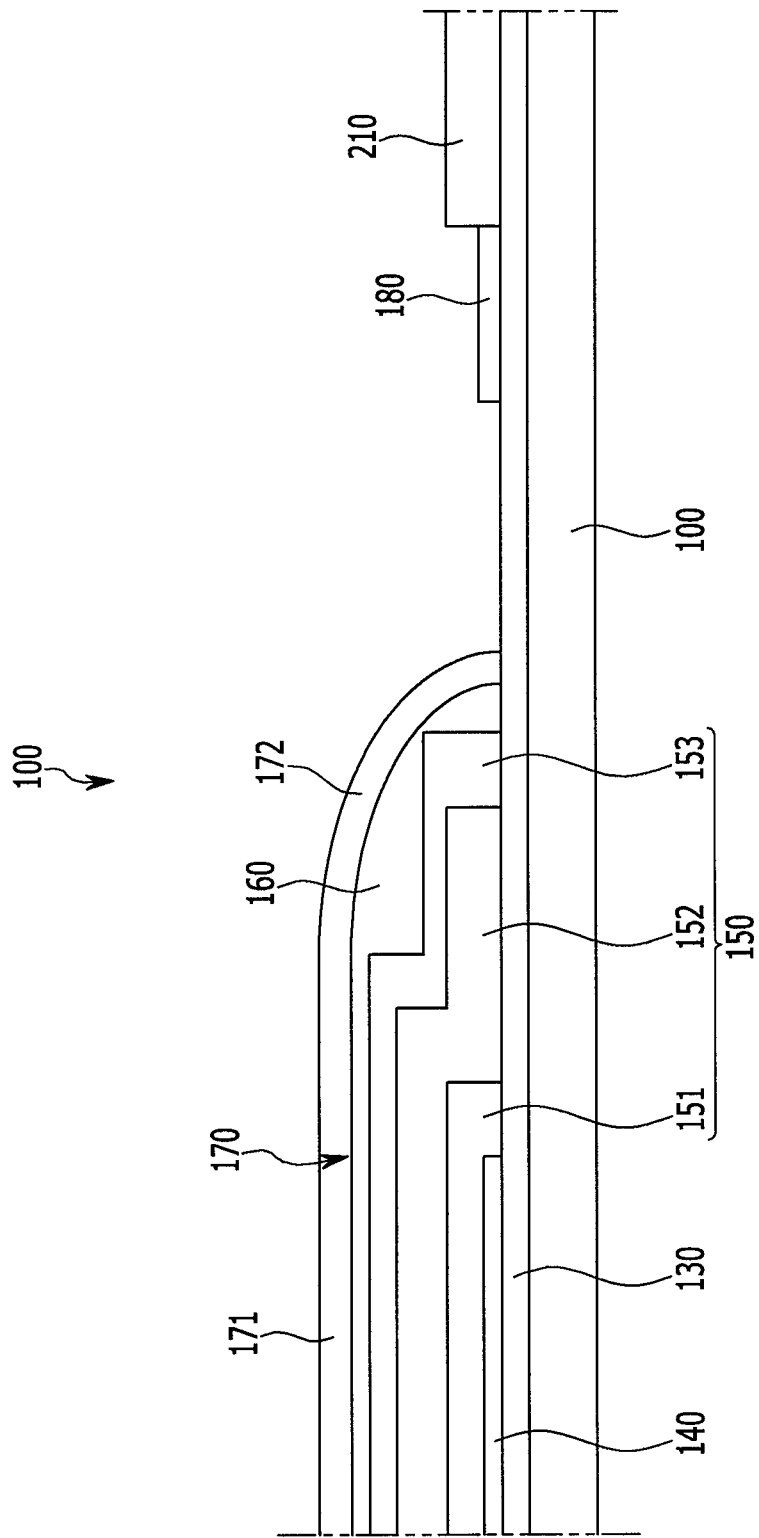
FIG. 4 is a cross-sectional view of a part of the flexible display device taken along line IV-IV of FIG. 3.

FIG. 3 is an enlarged diagram of a part III of FIG. 1, and FIG. 4 is a cross-sectional view of a part of the flexible display device taken along line IV-IV of FIG. 3.

Referring to FIGS. 3 and 4, on the display substrate 100 of the flexible display device 1 according to the exemplary embodiment, a semiconductor layer 130, a pixel 140, a passivation layer 150, an adhesive layer 160, a polarization film layer 170, and an insulating layer 180 are formed.

In more detail, the semiconductor layer 130 is formed on a front surface of the display substrate 100 and may be made of crystalline silicon such as, for example, low temperature poly-silicon (LTPS). A part of the semiconductor layer 130 is positioned in the display area 110 of the display substrate 100, and the other part is positioned in the peripheral area 120 of the display substrate 100.

The pixel 140 is formed on the semiconductor layer 130 positioned in the display area 110, and may include, for example, an organic light emitting diode (OLED). The pixel 140 or a plurality of the pixels 140 may have a matrix form formed when a data signal line and a scan signal line formed on the display substrate 100 cross each other. Since the detailed configuration of the pixel 140 is the same as the configuration of a general OLED, the detailed description thereof will be omitted.

The passivation layer 150 is formed on the upper side of the pixel 140 to protect the pixel 140 from oxygen, moisture, or the like.

The passivation layer 150 includes a first inorganic layer 151 covering the upper surface and the side of the pixel 140, an organic layer 152 covering the upper surface and the side of the first inorganic layer 151, and a second inorganic layer 153 covering the upper surface and the side of the organic layer 152 to form an outermost portion of the passivation layer 150. That is, in the passivation layer 150, the inorganic layers and the organic layer are alternately laminated to seal and protect the pixel 140.

In this case, steps are formed between central portions and outer portions of the organic layer 152 and the second inorganic layer 153. An upper side of the central portion of the organic layer 152 and the second inorganic layer 153 is positioned higher than the upper surface of the outer portion.

The passivation layer 150 according to the exemplary embodiment is described so that two inorganic layers 151 and 153 and one organic layer 152 are alternately disposed, but a configuration in which three or more inorganic layers and/or two or more organic layers 152 are disposed may be included in the spirit of the present invention.

Further, in the first inorganic layer 151 of the passivation layer 150 according to the exemplary embodiment, a step (at its side edge) is not formed between the central portion and the outer portion, but in another deposition process according to an exemplary embodiment, even in the first inorganic layer 151, a configuration in which the step is formed between the central portion and the outer portion is also possible.

The polarization film layer 170 is provided above the passivation layer 150 to cover the upper surface and the edge of the passivation layer 150, and the polarization film layer 170 improves a visibility of the display area 110 by suppressing an interference phenomenon due to reflection of external light.

That is, the polarization film layer 170 is provided at the upper side of the passivation layer 150, and an edge (side edge or left-or-right edge) of the polarization film layer 170 is further extended to the outside than an edge (side edge or left-or-right edge) of the passivation layer 150.

The polarization film layer 170 according to the exemplary embodiment completely covers the display area 110, and the edge region of the polarization film layer 170 may cover a part of the peripheral area 120.

The polarization film layer 170 has a first region 171 covering the upper surface of the passivation layer 150 and forming the central portion of the polarization film layer 170 and a second region 172 formed outside the first region 171 to cover the edge of the passivation layer 150.

In this case, the second region 172 is formed when the end is curved toward the display substrate 100, that is, the lower portion, and the end of the second region 172 is fixed to the semiconductor layer 130.

Between the polarization film layer 170 and the passivation layer 150, an adhesive layer 160 for fixing the polarization film layer 170 to the passivation layer 150 is formed. The adhesive layer 160 may be formed by coating, for example, an adhesive material or be an adhesive tape. In this case, a part of the adhesive layer 160 is positioned between the polarization film layer 170 and the semiconductor layer 130 to fix the end of the second region 172 of the polarization film layer 170 to the semiconductor layer 130.

That is, the polarization film layer 170 of the flexible display device 1 according to the exemplary embodiment is fixed to the passivation layer 150 and the semiconductor layer 130 while completely sealing the passivation layer 150 at the upper portion.

While the polarization film layer 170 completely covers the passivation layer 150, a part of the polarization film layer 170 is fixed to the semiconductor layer 130. As a result, an upward release (separation) of the passivation layer 150 by stress, which is occurred by an adhesion between the rear surface of control substrate 300 and the rear surface of display substrate 100, may be suppressed.

Meanwhile, between the edge of the passivation layer 150 and one end of the film wiring 210 fixed to the semiconductor layer 130, a wiring formed on the semiconductor layer 130 (by covering a part of the upper surface of the semiconductor layer 130 and/or an insulating layer 180) for protecting the semiconductor configuration is provided.

The edge of the polarization film layer 170 and the edge of the insulating layer 180 in the flexible display device 1 according to the exemplary embodiment are positioned to be spaced apart from each other by a set or predetermined distance. That is, in a region between the polarization film layer 170 and the insulating layer 180, the upper surface of the semiconductor layer 130 may be exposed.

According to the proposed exemplary embodiment, the damage to the passivation layer 150 may be suppressed due to the stress applied to the display substrate 100.

Further, there is an advantage of improving manufacturing yield of the flexible display device by suppressing the damage to the passivation layer 150.

Figure 5:
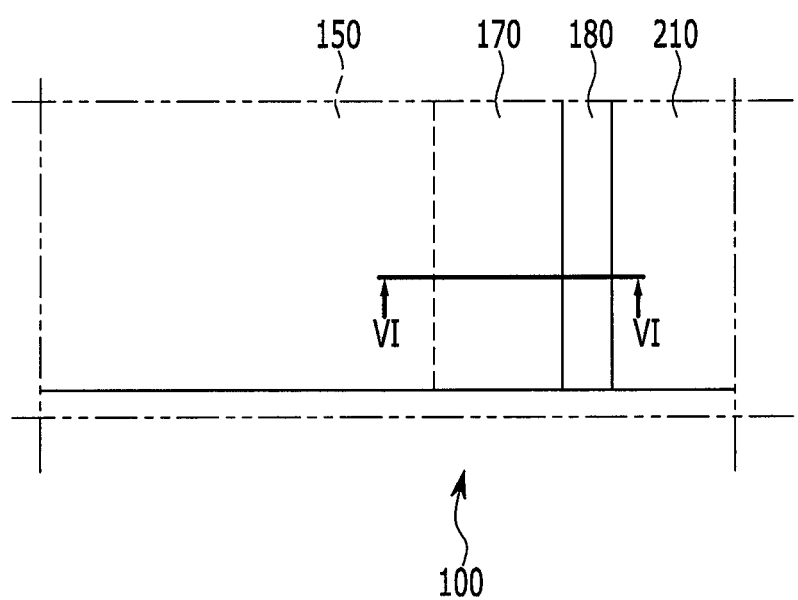
FIG. 5 is an enlarged view of a part of a flexible display device according to another exemplary embodiment of the present invention.
Figure 6:
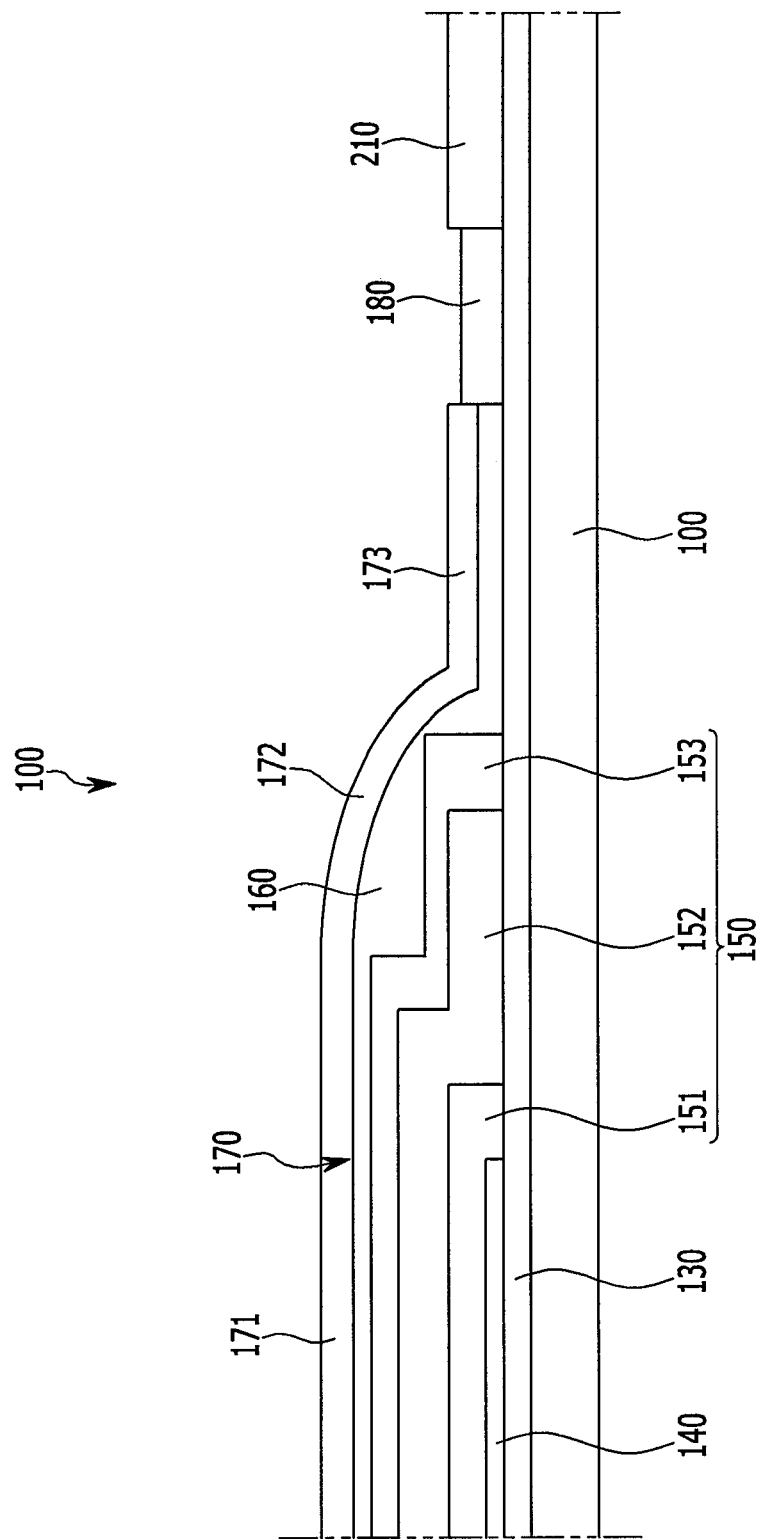
FIG. 6 is a cross-sectional view of a part of the flexible display device taken along line VI-VI of FIG. 5.

FIG. 5 is an enlarged view of a part of a flexible display device according to another exemplary embodiment of the present invention, and FIG. 6 is a cross-sectional view of a part of the flexible display device taken along line VI-VI of FIG. 5.

In the exemplary embodiment, there is a difference in the configuration of the polarization film layer 170, and other configurations are the same as the configurations of the flexible display device illustrated in FIGS. 1 to 6. Hereinafter, characteristic parts of the exemplary embodiment will be mainly described.

Referring to FIGS. 5 and 6, the polarization film layer 170 of the flexible display device 1 according to the exemplary embodiment further has a third region 173 extended outward from the end of the second region 172.

The third region 173 is fixed to the upper surface of the semiconductor layer 130, and the end of the third region 173, that is, the edge of the polarization film layer 170 contacts the edge of the insulating layer 180.

The polarization film layer 170 of the flexible display device 1 according to the exemplary embodiment is extended to the semiconductor layer 130 region, and as a result, there is an embodiment of suppressing the damage to the semiconductor layer 130 and the passivation layer 150 due to the stress applied to the display substrate 100.

Figure 7:
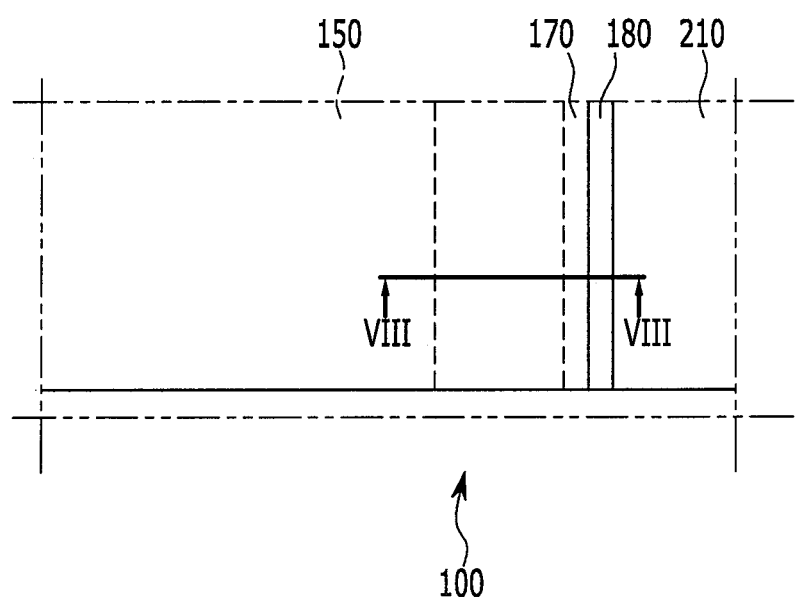
FIG. 7 is an enlarged view of a part of a flexible display device according to yet another exemplary embodiment of the present invention.
Figure 8:
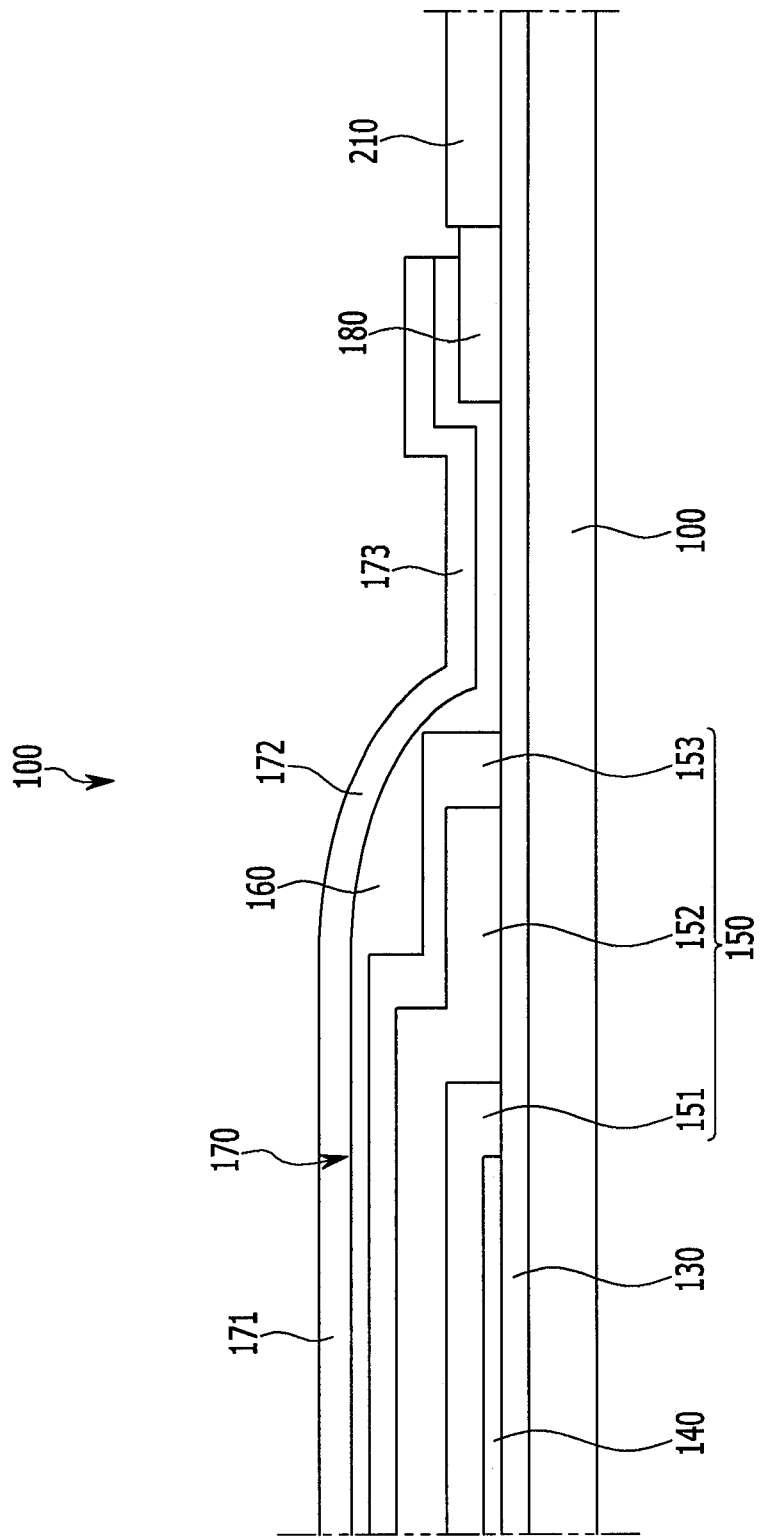
FIG. 8 is a cross-sectional view of a part of the flexible display device taken along line VIII-VIII of FIG. 7.

FIG. 7 is an enlarged view of a part of a flexible display device according to yet another exemplary embodiment of the present invention, and FIG. 8 is a cross-sectional view of a part of the flexible display device taken along line VIII-VIII of FIG. 7.

In the exemplary embodiment, there is a difference in the configuration of covering the polarization film layer 170 and a part of the upper surface of the insulating layer 180, and other configurations are the same as the configurations of the flexible display device illustrated in FIGS. 1 to 6. Hereinafter, characteristic parts of the exemplary embodiment will be mainly described.

Referring to FIGS. 7 and 8, the polarization film layer 170 of the flexible display device 1 according to the exemplary embodiment further has a third region 173 extended outward from the end of the second region 172.

In addition, a part of the third region 173 is fixed to the upper surface of the semiconductor layer 130 and the other part is fixed to the upper surface of the insulating layer 180. That is, the edge of the polarization film layer 170 is positioned on the upper surface of the insulating layer 180.

Between the third region 173 and the semiconductor layer 130 and between the third region 173 and the insulating layer 180, adhesive layers 160 are provided to be adhered to each other.

In this case, since the upper surface of the insulating layer 180 is formed at a position higher than the upper surface of the semiconductor layer 130, a step with a set or predetermined size is formed between the part of the third region 173 positioned above the semiconductor layer 130 and the other part of the third region 173 positioned above the insulating layer 180.

Figure 9:
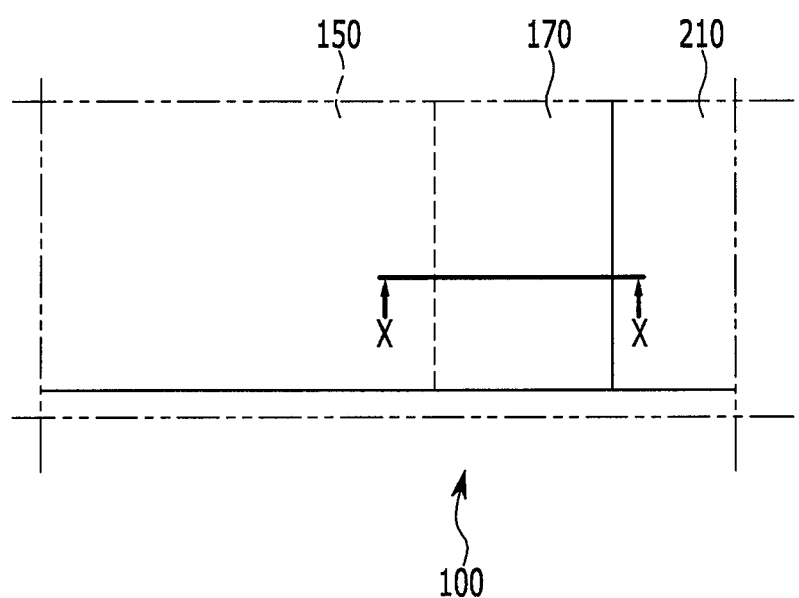
FIG. 9 is an enlarged view of a part of a flexible display device according to still another exemplary embodiment of the present invention.
Figure 10:
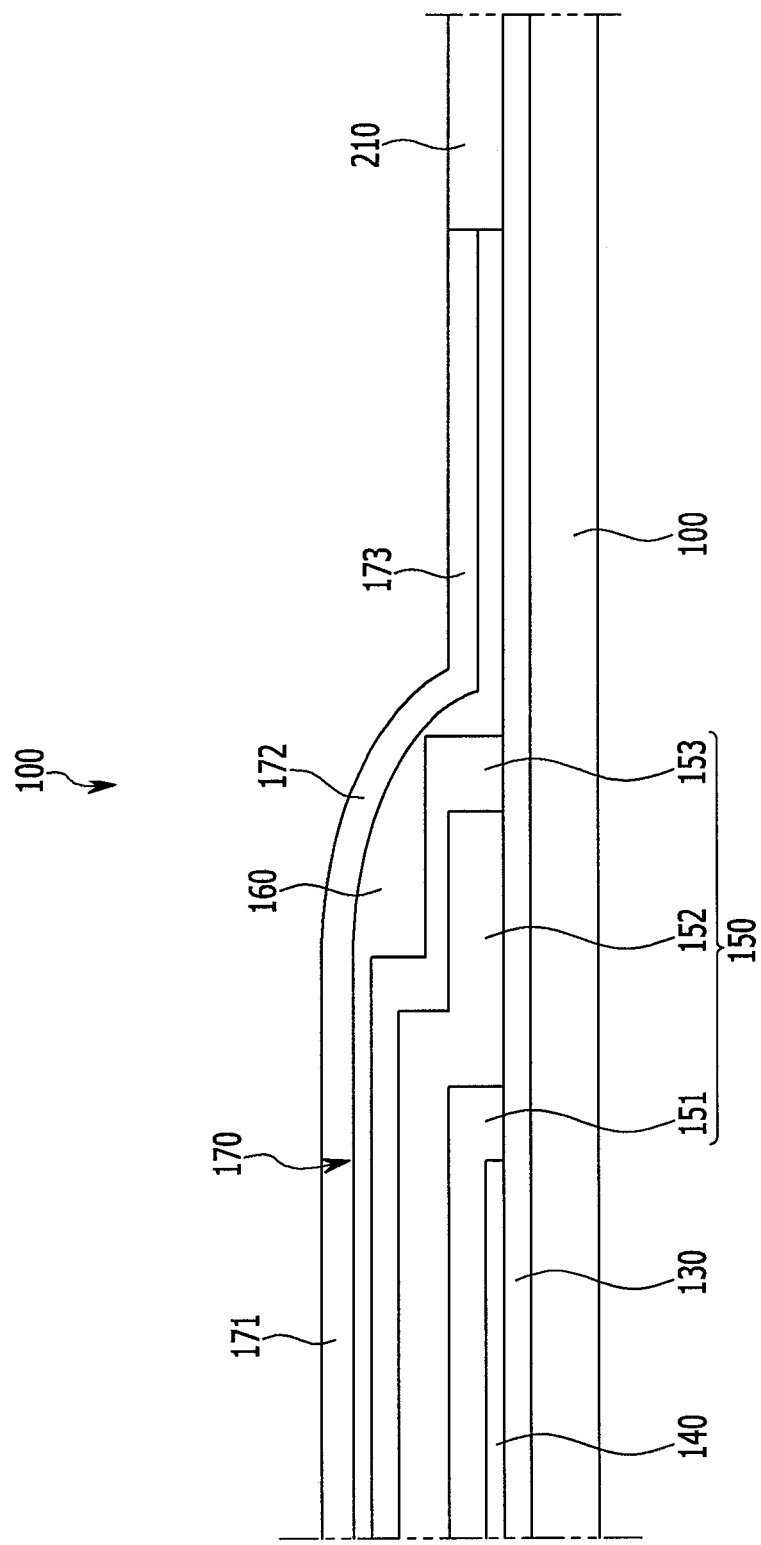
FIG. 10 is a cross-sectional view of a part of the flexible display device taken along line X-X of FIG. 9.

FIG. 9 is an enlarged view of a part of a flexible display device according to still another exemplary embodiment of the present invention, and FIG. 10 is a cross-sectional view of a part of the flexible display device taken along line X-X of FIG. 9.

In the exemplary embodiment, there is a difference in a configuration in which the insulating layer 180 is removed, and other configurations are the same as the configurations of the flexible display device illustrated in FIGS. 1 to 6. Hereinafter, characteristic parts of the exemplary embodiment will be mainly described.

Referring to FIGS. 9 and 10, the polarization film layer 170 of the flexible display device 1 according to the exemplary embodiment further has a third region 173 extended outward from the end of the second region 172.

In this case, the end of the third region 173, that is, the edge of the polarization film layer 170 contacts the edge of the film wiring 210.

That is, the polarization film layer 170 covers the passivation layer 150 and the upper surface of the semiconductor layer 130 positioned between the passivation layer 150 and the film wiring 210 to suppress the damage to the passivation layer 150 or the semiconductor layer 130 due to the stress applied to the display substrate 100.

Figure 11:
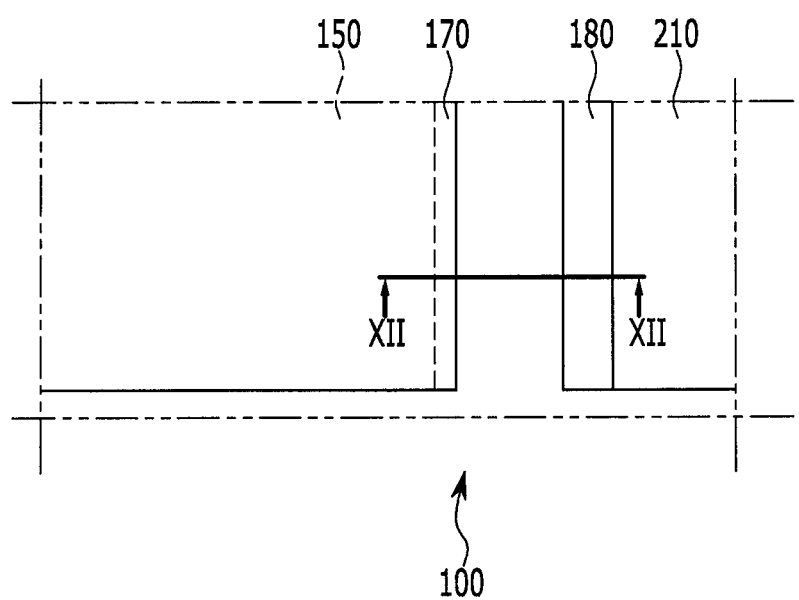
FIG. 11 is an enlarged view of a part of a flexible display device according to still yet another exemplary embodiment of the present invention.
Figure 12:
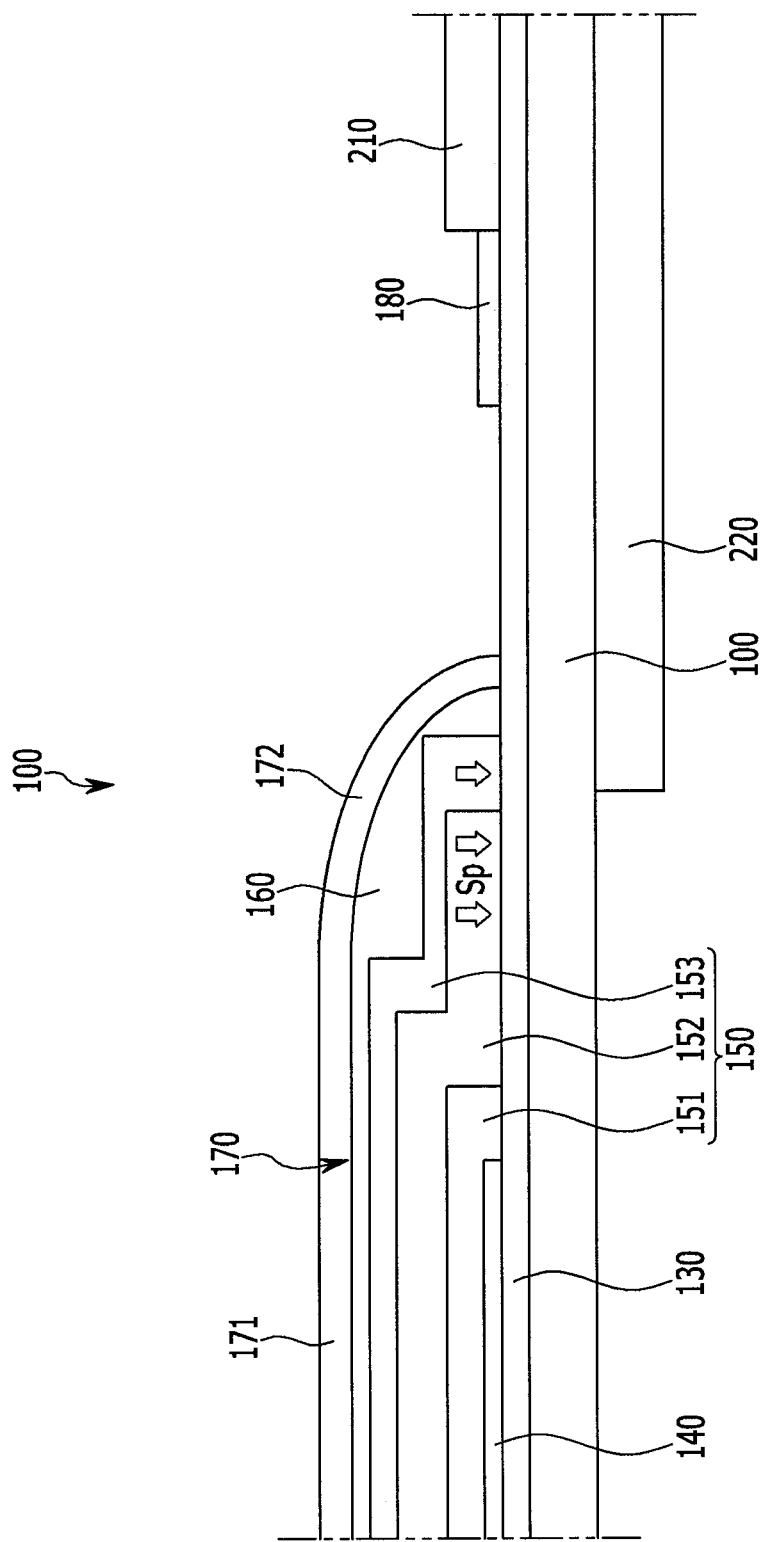
FIG. 12 is a cross-sectional view of a part of the flexible display device taken along line XII-XII of FIG. 11.

FIG. 11 is an enlarged view of a part of a flexible display device according to still yet another exemplary embodiment of the present invention, and FIG. 12 is a cross-sectional view of a part of the flexible display device taken along line XII-XII of FIG. 11.

In the exemplary embodiment, there is a difference in a configuration in which pre-stress is applied to the passivation layer 150, and other configurations are the same as the configurations of the flexible display device illustrated in FIGS. 1 to 6. Hereinafter, characteristic parts of the exemplary embodiment will be mainly described.

Referring to FIGS. 11 and 12, in a forming process of the passivation layer 150 according to the exemplary embodiment, pre-stress Sp is applied to the passivation layer 150 in a first direction. The pre-stress Sp may be compressive stress or a bending moment.

The pre-stress Sp may be formed by using a difference in adhesion or a difference in thermal expansion coefficient between a plurality of sub-layers 151, 152, and 153 forming the passivation layer 150. However, this is just an exemplary method for forming the pre-stress Sp, and a configuration of forming the pre-stress Sp in the passivation layer 150 by another method may be also included in the exemplary embodiment of the present invention.

The first direction applied to the passivation layer 150 according to the exemplary embodiment is formed in a direction toward the display substrate 100, that is, downward from the passivation layer 150. In this case, when the pre-stress Sp is the bending moment, the first direction of the pre-stress Sp is formed in a direction downward from the end of the passivation layer 150.

Accordingly, the control substrate 300 is adhered and fixed to the rear surface of the display substrate 100, and as a result, stress applied to the passivation layer 150 in a second direction which is an opposite direction of the first direction, that is, upwards and the pre-stress Sp formed in the passivation layer 150 offset each other to suppress the damage to the passivation layer 150 due to the stress.

It is described that the polarization film layer 170 of the flexible display device 1 according to the exemplary embodiment covers the upper surface and the edge of the passivation layer 150, but a configuration in which the polarization film layer 170 is formed only on the upper surface of the passivation layer 150 may be also included in the spirit of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the terms "use," "using," and "used" may be considered synonymous with the terms "utilize," "utilizing," and "utilized," respectively. Further, the use of "may" when describing embodiments of the inventive concept refers to "one or more embodiments of the inventive concept." Also, the term "exemplary" is intended to refer to an example or illustration.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the display device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flexible display device, comprising:
    a display substrate having a display area and a peripheral area surrounding the display area;
    a plurality of pixels in the display area;
    at least one passivation layer covering the pixels from a top of the pixels to protect the pixels;
    a polarization layer at a top of the at least one passivation layer and of which an edge is extended outside an edge of the at least one passivation layer; and
    a film wiring comprising a flexible material of which one end is connected to the peripheral area,
        wherein the polarization layer comprises a first region covering an upper surface of the at least one passivation layer and a second region formed outside the first region and covering the edge of the at least one passivation layer,
        wherein the second region of the polarization layer is outside of the at least one passivation layer,
        wherein the polarization layer does not overlap the film wiring,
        wherein the second region covers a side of the edge of the at least one passivation layer and an end portion of the second region overlaps an area between the passivation layer and the film wiring, and
        wherein an end of the second region of the polarization layer is curved toward the display substrate.

2. The flexible display device of claim 1, wherein:
    the polarization layer has a third region extending outside the second region from the end of the second region.

3. The flexible display device of claim 1, further comprising an insulating layer disposed between the edge of the passivation layer and an edge of the film wiring.

4. The flexible display device of claim 3, wherein:
    the polarization layer covers at least a part of an upper surface of the insulating layer.

5. The flexible display device of claim 3, wherein:
    the insulating layer has a portion contacting the polarization layer, and
    the portion contacting the polarization layer is a side portion of the insulating layer.

6. The flexible display device of claim 5, wherein a side surface of the insulating layer and a side surface of the polarization layer contact each other.

7. The flexible display device of claim 3, wherein the insulating layer is disposed between the passivation layer and the film wiring in a parallel direction to a first surface of the display substrate.

8. The flexible display device of claim 1, wherein:
    the passivation layer comprises a first inorganic layer covering the pixels, an organic layer covering the first inorganic layer, and a second inorganic layer covering the organic layer and forming an outermost portion of the passivation layer.

9. The flexible display device of claim 8, wherein:
    in at least one of the first inorganic layer, the second inorganic layer, and the organic layer, a step is formed between a central portion and an outer portion.

10. The flexible display device of claim 1, further comprising:
    a control substrate of which another end of the film wiring is connected to one side and which is positioned at a second surface of the display substrate facing oppositely away from the passivation layer.

11. The flexible display device of claim 1, further comprising:
    a control substrate of which another end of the film wiring is connected to one side and which is positioned on a second surface of the display substrate.

12. The flexible display device of claim 1, wherein:
    the passivation layer comprises at least one organic layer and at least one inorganic layer.

13. The flexible display device of claim 1, wherein:
    the polarization layer is spaced from the film wiring, and
    wherein the second region extends along at least a portion of the side of the edge of the passivation layer toward the display substrate.

14. The flexible display device of claim 1, further comprising:

a layer on a first surface of the display substrate and under the pixel of the display area.

15. The flexible display device of claim 14, wherein:
the layer is covered by the polarization layer, and then the layer is not exposed.

16. The flexible display device of claim 15, wherein:
the layer comprises a semiconductor layer.

17. The flexible display device of claim 1, further comprising:
an adhesive layer between the polarization layer and the passivation layer.

18. The flexible display device of claim 17, wherein:
the adhesive layer is disposed along the polarization layer.

19. The flexible display device of claim 17, further comprising:
a layer on a first surface of the display substrate and under the pixel of the display area, and
wherein the adhesive layer directly contacts to the layer.

20. The flexible display device of claim 1, wherein:
the passivation layer covers the pixels from a top of the pixels to protect the pixels.

21. The flexible display device of claim 1, wherein:
the second region is formed outside the first region and covering the edge of the passivation layer.

22. The flexible display device of claim 21, wherein:
wherein the second region extends along at least a portion of the side of the edge of the passivation layer toward the display substrate.

23. A flexible display device, comprising:
a display substrate having a display area and a peripheral area surrounding the display area;
a plurality of pixels in the display area;
at least one passivation layer covering the pixels from a top of the pixels to protect the pixels;
a polarization layer at a top of the at least one passivation layer and of which an edge is extended outside an edge of the at least one passivation layer; and
a film wiring comprising a flexible material of which one end is connected to the peripheral area,
an insulating layer between the edge of the at least one passivation layer and an edge of the film wiring,
wherein the polarization layer comprises a first region covering an upper surface of the at least one passivation layer and a second region formed outside the first region and covering the edge of the at least one passivation layer,
wherein the second region of the polarization layer is outside of the at least one passivation layer,
wherein the polarization layer does not overlap the film wiring,
wherein the second region covers a side of the edge of the at least one passivation layer and an end portion of the second region overlaps an area between the passivation layer and the film wiring, and
wherein the edge of the polarization layer contacts the edge of the insulating layer.

24. The flexible display device of claim 23, further comprising:
a layer on a first surface of the display substrate and under the pixel of the display area.

25. The flexible display device of claim 24, wherein:
the layer is covered by the polarization layer, and then the layer is not exposed.

26. The flexible display device of claim 25, wherein:
the layer comprises a semiconductor layer.

27. The flexible display device of claim 23, further comprising:
an adhesive layer between the polarization layer and the passivation layer.

28. The flexible display device of claim 27, wherein:
the adhesive layer is disposed along the polarization layer, and contacts to the insulating layer.

29. The flexible display device of claim 27, further comprising:
a layer on a first surface of the display substrate and under the pixel of the display area, and
wherein the adhesive layer directly contacts to the layer.

30. The flexible display device of claim 23, wherein the insulating layer is disposed between the passivation layer and the film wiring in a parallel direction to a surface of the display substrate.

31. The flexible display device of claim 23, wherein a side surface of the insulating layer and a side surface of the polarization layer contact each other.

* * * * *